United States Patent
Hsu et al.

(10) Patent No.: US 11,437,994 B2
(45) Date of Patent: Sep. 6, 2022

(54) TOUCH SENSOR AND KEYBOARD USING THE SAME

(71) Applicant: PIXART IMAGING INC., Hsin-Chu (TW)

(72) Inventors: Che-Chia Hsu, Hsin-Chu (TW);
Yu-Han Chen, Hsin-Chu (TW);
Chi-Chieh Liao, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 17/134,940

(22) Filed: Dec. 28, 2020

(65) Prior Publication Data
US 2022/0209771 A1    Jun. 30, 2022

(51) Int. Cl.
*H03K 17/96* (2006.01)
*G06F 3/044* (2006.01)
*G06F 3/02* (2006.01)

(52) U.S. Cl.
CPC ....... *H03K 17/9622* (2013.01); *G06F 3/0202* (2013.01); *G06F 3/0446* (2019.05); *G06F 3/0447* (2019.05); *G06F 2203/04102* (2013.01)

(58) Field of Classification Search
CPC . H03K 17/9622; G06F 3/0202; G06F 3/0446; G06F 3/0447; G06F 2203/04102
See application file for complete search history.

(56) References Cited

U.S. PATENT DOCUMENTS

| | | | | |
|---|---|---|---|---|
| 7,659,887 B2* | 2/2010 | Larsen | ........... | G06F 3/0213 345/170 |
| 8,735,755 B2* | 5/2014 | Peterson | ........... | H03K 17/9622 200/600 |
| 10,289,210 B1* | 5/2019 | Wang | ........... | G06F 3/0445 |
| 10,394,341 B1* | 8/2019 | Wang | ........... | G06F 3/0304 |
| 10,514,772 B1* | 12/2019 | Wang | ........... | G06F 3/0202 |
| 10,732,728 B1* | 8/2020 | Sunshine | ........... | G06F 1/1662 |
| 10,860,112 B1* | 12/2020 | Knoppert | ........... | H01L 41/09 |
| 10,866,615 B1* | 12/2020 | Ng | ........... | G06F 3/0447 |
| 10,990,204 B1* | 4/2021 | Trim | ........... | G06F 1/1669 |
| 11,003,289 B1* | 5/2021 | Hsu | ........... | G06F 1/1652 |
| 11,079,816 B1* | 8/2021 | North | ........... | G06F 3/016 |
| 11,079,849 B1* | 8/2021 | Knoppert | ........... | G06F 3/038 |
| 11,093,048 B1* | 8/2021 | Knoppert | ........... | G06F 3/023 |
| 2008/0094373 A1* | 4/2008 | Song | ........... | G06F 1/1662 345/173 |
| 2010/0148995 A1* | 6/2010 | Elias | ........... | G06F 3/0488 178/18.03 |
| 2012/0228111 A1* | 9/2012 | Peterson | ........... | H03K 17/98 200/600 |
| 2012/0242592 A1* | 9/2012 | Rothkopf | ........... | G06F 3/041 345/173 |
| 2012/0274599 A1* | 11/2012 | Schediwy | ........... | G06F 3/0447 345/174 |

(Continued)

*Primary Examiner* — Amy Onyekaba
(74) *Attorney, Agent, or Firm* — Li & Cai Intellectual Property (USA) Office

(57) ABSTRACT

A touch sensor and a keyboard using the same are provided. The touch sensor includes a plurality of main sensor structures and a plurality of resilient structures. Any two adjacent ones of the main sensor structures have a gap therebetween. Each of the resilient structures is connected between two adjacent ones of the main sensor structures, and each of the resilient structures has a cross-sectional width that is less than a width of the gap.

7 Claims, 8 Drawing Sheets

(56) References Cited

U.S. PATENT DOCUMENTS

| | | | | |
|---|---|---|---|---|
| 2012/0299832 | A1* | 11/2012 | Peterson | G06F 3/0202 345/168 |
| 2013/0083496 | A1* | 4/2013 | Franklin | G06F 3/044 361/752 |
| 2013/0126325 | A1* | 5/2013 | Curtis | H03K 17/9622 200/600 |
| 2013/0234939 | A1* | 9/2013 | Lee | G06F 3/0213 345/158 |
| 2014/0029216 | A1* | 1/2014 | Ukita | H05K 1/181 361/752 |
| 2014/0034472 | A1* | 2/2014 | Krumpelman | H01H 13/85 200/341 |
| 2014/0138227 | A1* | 5/2014 | Chen | H01H 13/83 200/5 A |
| 2014/0166454 | A1* | 6/2014 | Chen | H03K 17/975 200/5 A |
| 2014/0251776 | A1* | 9/2014 | Kim | H01H 13/66 200/5 R |
| 2015/0128728 | A1* | 5/2015 | Salo | G06F 1/1652 73/862.626 |
| 2015/0193008 | A1* | 7/2015 | Bolender | G06F 3/03547 345/168 |
| 2015/0346839 | A1* | 12/2015 | Kawaguchi | G06F 3/0445 345/168 |
| 2016/0378202 | A1* | 12/2016 | Hsieh | G06F 3/0338 345/161 |
| 2017/0005077 | A1* | 1/2017 | Kim | G06F 1/1643 |
| 2017/0040306 | A1* | 2/2017 | Kim | H05K 1/181 |
| 2017/0068318 | A1* | 3/2017 | McClure | G06F 3/016 |
| 2017/0315624 | A1* | 11/2017 | Leong | H01H 13/83 |
| 2017/0351341 | A1* | 12/2017 | Norwalk | G06F 3/021 |
| 2017/0356812 | A1* | 12/2017 | Madden | G01L 1/146 |
| 2018/0052524 | A1* | 2/2018 | Peterson | G02B 6/0068 |
| 2018/0217668 | A1* | 8/2018 | Ligtenberg | G06V 40/107 |
| 2019/0033923 | A1* | 1/2019 | Wang | G06F 1/1637 |
| 2019/0163273 | A1* | 5/2019 | Yang | G06F 3/016 |
| 2019/0234817 | A1* | 8/2019 | Sun | G06F 3/045 |
| 2019/0265820 | A1* | 8/2019 | Li | H01L 24/42 |
| 2020/0103981 | A1* | 4/2020 | Hsu | H01H 13/83 |
| 2020/0152402 | A1* | 5/2020 | Su | H01H 13/85 |
| 2020/0348774 | A1* | 11/2020 | Hsu | G06F 3/0202 |
| 2020/0371659 | A1* | 11/2020 | Kim | G06F 3/04142 |
| 2021/0208682 | A1* | 7/2021 | Knoppert | G06F 3/016 |
| 2021/0240267 | A1* | 8/2021 | Gajiwala | G06F 3/0414 |
| 2021/0240281 | A1* | 8/2021 | Knoppert | G06F 3/023 |
| 2021/0240282 | A1* | 8/2021 | Gajiwala | G06F 3/03547 |
| 2021/0240283 | A1* | 8/2021 | Knoppert | G06F 3/016 |
| 2021/0247850 | A1* | 8/2021 | Norwalk | G06F 3/021 |
| 2021/0358342 | A1* | 11/2021 | Liu | H01L 51/0097 |

* cited by examiner

TOUCH SENSOR AND KEYBOARD USING THE SAME

FIELD OF THE DISCLOSURE

The present disclosure relates to a sensor and an input device using the same, and more particularly to a touch sensor and a keyboard using the same.

BACKGROUND OF THE DISCLOSURE

Keyboards are widely used in a computer system to serve as a user interface to allow a user to operate the computer system. Common keyboard types include "dome-switch" or "scissor-switch" keyboards. These keyboards include mechanical keys that are configured to move independent of one another and comply with standards for key spacing and actuation force.

Recently, a touch sensitive mechanical keyboard, which combines both functions of a mouse device and a traditional keyboard, has been developed. That is to say, the touch sensitive mechanical keyboard can operate in two or more modes, e.g., a typing mode and a mouse mode, so that a user can not only input commands but also control a cursor position in a display.

A conventional touch sensitive mechanical keyboard may include a plurality of mechanical keys and a touch sensitive structure. The touch sensitive structure may include a membrane or a flexible printed circuit (FPC) and a plurality of touch sensing electrodes formed on the membrane (or the FPC). Each of the touch sensing electrodes is arranged to correspond to the position of at least one of the mechanical keys. The membrane is usually made of flexible material. As such, when a user presses one of the mechanical keys, a portion of the membrane (or the FPC) that corresponds to the position of the pressed mechanical key is also forced into deformation. However, unlike the mechanical keys, each of which is independently operable, a deformation amount in a pressed portion of the membrane (or the FPC) is restricted by another portion, thereby affecting a tactile sensation of the user. For the conventional touch sensitive mechanical keyboard including a decorative layer to cover and protect the mechanical keys, the tactile sensation would be affected more significantly.

Specifically, the decorative layer is usually made of a material having a tactile quality. However, when the decorative layer is pressed by the user, the degree of deformation in the pressed portion of the touch sensitive structure would be also restricted by the decorative layer since the touch sensitive structure and the decorative layer are respectively made of different materials and are adhered to each other. The tactile sensation of pressing the mechanical keys would be severely affected.

SUMMARY OF THE DISCLOSURE

In response to the above-referenced technical inadequacies, the present disclosure provides a touch sensor and a keyboard using the same, in which a structure of the touch sensor is modified such that different portions of the touch sensor can be independently deformed while receiving a pressing force.

In one aspect, the present disclosure provides a touch sensor including a base layer, a plurality of sensor electrode pairs, and a plurality of connecting wires. The base layer includes a plurality of arrangement portions and a plurality of connecting portions. Any two adjacent ones of the arrangement portions have a gap therebetween that allows one of the connecting portions to be connected therebetween. The sensor electrode pairs are respectively disposed on the arrangement portions to form a plurality of main sensor structures. The connecting wires are respectively disposed on the connecting portions to form a plurality of resilient structures. Each of the resilient structures has a cross-sectional width less than a width of the gap.

In certain embodiments, each of the main sensor structures and one of the resilient structures connected thereto jointly define a hollow region.

In certain embodiments, each of the resilient structures has a strip-shaped section located in the gap and two bending sections, and two bending sections are respectively connected to two opposite ends of the strip-shaped section and respectively extend toward two adjacent ones of the arrangement portions.

In certain embodiments, the resilient structures include a plurality of first resilient structures and a plurality of second resilient structures. Each of the first resilient structures is connected between two adjacent ones of the main sensor structures that are arranged in a first direction, and the strip-shaped section of each of the first resilient structures extends along a second direction and has a first length. Each of the second resilient structures is connected between two adjacent ones of the main sensor structures that are arranged in the second direction. The strip-shaped section of each of the second resilient structures extends along the first direction and has a second length, and the second length is greater than the first length.

Furthermore, a shortest distance between any two adjacent ones of the strip-shaped sections of the second resilient structures is less than that between any two adjacent ones of the strip-shaped sections of the first resilient structures.

In certain embodiments, each of the sensor electrode pairs includes a first electrode and a second electrode that are insulated from each other, and the first electrode and the second electrode partially overlap with each other in a thickness direction of the base layer.

In certain embodiments, the connecting wires include a plurality of first connecting wires and a plurality of second connecting wires, each of the first connecting wires is connected between two of the first electrodes that are respectively disposed on two adjacent ones of the arrangement portions, and each of the second connecting wires is connected between two of the second electrodes that are respectively disposed on two adjacent ones of the arrangement portions.

In certain embodiments, the first electrode and the second electrode of each of the sensor electrode pairs are respectively located at two opposite sides of the base layer.

In certain embodiments, each of the main sensor structures has four corners, and the four corners are respectively connected to four of the resilient structures.

In another aspect, the present disclosure provides a touch sensor including a plurality of main sensor structures and a plurality of resilient structures. Any two adjacent ones of the main sensor structures have a gap therebetween. Each of the resilient structures is connected between two adjacent ones of the main sensor structures, and each of the resilient structures has a cross-sectional width less than a width of the gap.

In certain embodiments, each of the main sensor structures includes an arrangement portions and a sensor electrode pair, and the sensor electrode pair is disposed on the arrangement portion.

In certain embodiments, each of the resilient structure includes a connecting portion and a connecting wire disposed on the connecting portion, and the connecting portion and the arrangement portion jointly form a base layer.

In certain embodiments, each of the main sensor structures and one of the resilient structures connected thereto jointly define a hollow region.

In certain embodiments, each of the main sensor structures has four corners, and the four corners are each connected to one of resilient structures.

In certain embodiments, each of the main sensor structures has four sides, and the four sides are each connected to one of resilient structures.

In certain embodiments, any four of the main sensor structures that are arranged in matrix arrangement and four of the resilient structures that are connected therebetween jointly define an opening pattern.

In yet another aspect, the present disclosure provides a keyboard including a plurality of key units, a covering layer, and the touch sensor. Each of the key units includes a keycap. The covering layer is disposed on the key units and includes a plurality of protrusion regions. The protrusion regions are respectively in alignment with the keycaps of the key units. The touch sensor is disposed between the key units and the covering layer.

In certain embodiments, the keyboard further includes a plurality of upper adhesive layers and a plurality of lower adhesive layers. A part of the plurality of main sensor structures is connected to the corresponding protrusion regions by the upper adhesive layers and connected to the corresponding keycaps by the lower adhesive layers, and a remaining part of the plurality of main sensor structures are neither connected to the upper adhesive layers nor the lower adhesive layers.

In certain embodiments, the touch sensor further includes a protective layer and each of the sensor electrode pairs is disposed between the base layer and protective layer.

Therefore, by virtue of "any two adjacent ones of the main sensor structures (or arrangement portions) having a gap therebetween" and "each of the resilient structures (or connecting portions) being connected between two adjacent ones of the main sensor structures (or arrangement portions), and each of the resilient structures (or connecting portions) having a cross-sectional width less than a width of the gap," the touch sensor can be partially deformed. When the touch sensor is implemented in the keyboard, the resilient structures allows a number of the main sensor structures receiving a pressing force to be individually deformed, and can prevent the touch sensor from interfering with a downward motion of the keycap. Furthermore, the keyboard including the touch sensor of the present disclosure can provide a better tactile sensation to the user.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
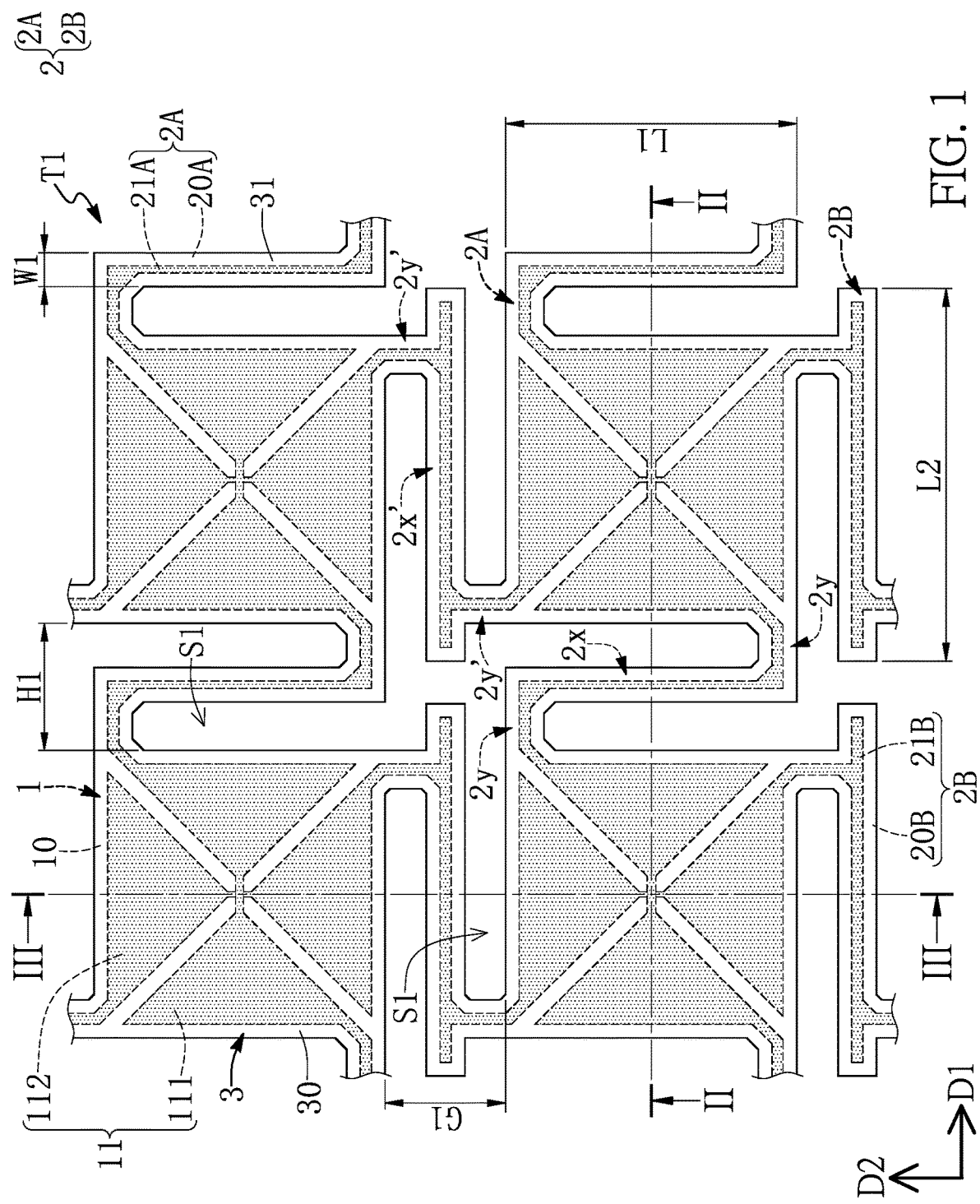
FIG. 1 is a partial top schematic view of a touch sensor according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
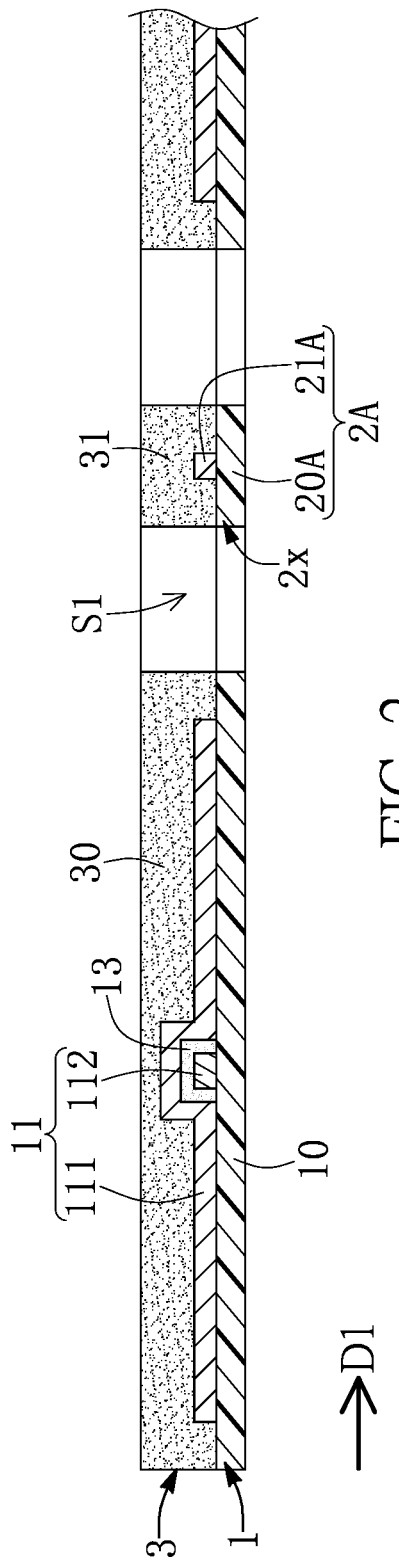
FIG. 2 is a cross-sectional view taken along line II-II of FIG. 1.
Figure 3:
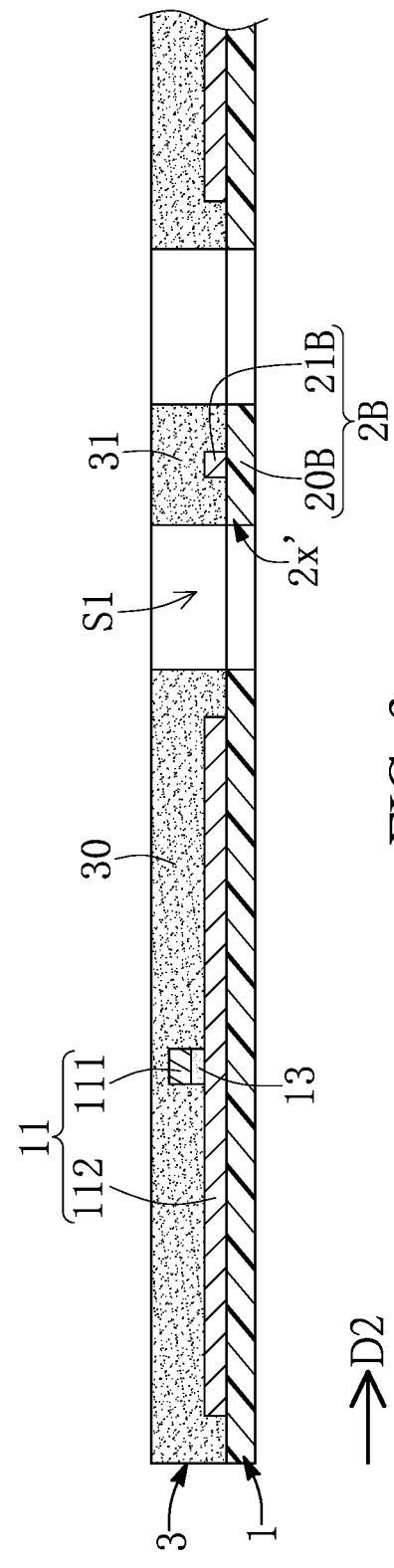
FIG. 3 is a cross-sectional view taken along line III-III of FIG. 1.

Reference is made to FIG. 1 to FIG. 3. FIG. 1 is a partial top schematic view of a touch sensor according to a first embodiment of the present disclosure. FIG. 2 is a cross-sectional view taken along line II-II of FIG. 1. FIG. 3 is a cross-sectional view taken along line III-III of FIG. 1.

The touch sensor T1 of the present disclosure is used to detect touch events and touched positions. In the instant embodiment, the touch sensor T1 is a capacitive touch sensor. As shown in FIG. 1, the touch sensor T1 includes a plurality of main sensor structures 1 and a plurality of resilient structures 2.

The main sensor structures 1 are arranged in an array. That is to say, the main sensor structures 1 are arranged in rows and columns respectively in first and second directions D1, D2. In the instant embodiment, each of the main sensor structures 1 has a quadrilateral shape from a perspective top view. That is to say, each of the main sensor structures 1 has four sides and four corners. However, a top-view shape of the main sensor structure 1 is not limited to the example provided herein. In another embodiment, the main sensor structure 1 may have another geometric shape from the top view.

As shown in FIG. 1, each of the main sensor structures 1 includes an arrangement portion 10 and a sensor electrode pair 11. The arrangement portion 10 is made of a flexible insulating material.

The sensor electrode pair 11 is disposed on the arrangement portion 10. The sensor electrode pair 11 includes a first electrode 111 and a second electrode 112. The first electrode 111 extends in the first direction D1, and the second electrode 112 extends in the second direction D2.

As shown in FIG. 2, in the instant embodiment, the first and second electrodes 111, 112 are jointly disposed at the same side of the arrangement portion 10. Furthermore, the first electrode 111 and the second electrode 112 partially overlap with each other in a thickness direction of the arrangement portion 10. However, the first electrode 111 and the second electrode 112 are insulated from each other. Specifically, a portion of the first electrode 111 that overlaps with the second electrode 112 is insulated from the second electrode 112 by an insulating portion 13. The first and second electrodes 111, 112 of each of the sensor electrode pair 11 jointly form a capacitor. By detecting a variation of a coupling capacitance between the first and second electrodes 111, 112 of each of the sensor electrode pair 11, the touched position can be determined.

In the instant embodiment, any two adjacent ones of the main sensor structures 1 have a gap G1 therebetween, and each of the resilient structures 2 is connected between two adjacent ones of the main sensor structures 1. Furthermore, each of the resilient structures 2 has a cross-sectional width W1 less than a width H1 of the gap G1.

As shown in FIG. 1, each of the main sensor structures 1 and one of the resilient structures 2 connected thereto jointly define a hollow region (not labelled). To be more specific, in the instant embodiment, any four of the main sensor structures 1 that are arranged in a matrix arrangement and four of the resilient structures 2 that are connected therebetween jointly define an opening pattern S1. Accordingly, compared to a conventional touch sensitive structure, the touch sensor T1 of the present disclosure has a plurality of opening patterns S1. In other words, the main sensor structures 1 and the resilient structures 2 jointly form a mesh-like or net-like structure so that the stretchability of the touch sensor T1 is improved.

When the touch sensor T1 receives a pressing force, it is easier for the touch sensor T1 to be partially deformed. Specifically, each of the resilient structure 2 is stretchable. When a number of the main sensor structures 1 are pressed, each of the resilient structures 2 connected between one of the pressed main sensor structures 1 and one of the unpressed main sensor structures 1 would be elongated, downwardly tilted, or slightly twisted due to a pressing force being applied to the touch sensor T1, such that a number of the pressed main sensor structures 1 can be individually depressed.

As shown in FIG. 1, the four corners of each of the main sensor structures 1 are respectively connected to four of the resilient structures 2. Each of the resilient structures 2 has a strip-shaped section $2x$ ($2x'$) and two bending sections $2y$ ($2y'$). The strip-shaped section $2x$ ($2x'$) is located in the gap G1 and extends in a direction that is substantially parallel to one edge of the main sensor structures 1. The two bending sections $2y$ ($2y'$) are respectively connected to two opposite ends of the strip-shaped section $2x$ ($2x'$) and respectively extend toward two adjacent ones of the main sensor structures 1. In other words, in the instant embodiment, each of the resilient structures 2 is formed essentially in a Z-shape from the top view.

Furthermore, the resilient structures 2 include a plurality of first resilient structures 2A and a plurality of second resilient structures 2B. Each of the first resilient structures 2A is connected between two adjacent ones of the main sensor structures 1 that are arranged in the first direction D1. That is to say, the main sensor structures 1 arranged in the same row are connected to one another by the first resilient structures 2A. However, the strip-shaped section $2x$ of each of the first resilient structures 2A extends along the second direction D2 and has a first length L1.

Each of the second resilient structures 2B is connected between two adjacent ones of the main sensor structures 1 that are arranged in the second direction D2. That is, the main sensor structures 1 arranged in the same column are connected to one another by the second resilient structures 2B. The strip-shaped section $2x'$ of each of the second resilient structures 2B extends along the first direction D1 and has a second length L2.

In the instant embodiment, the second length L2 is greater than the first length L1. Accordingly, as shown in FIG. 1, a shortest distance between any two adjacent ones of the strip-shaped sections $2x'$ of the second resilient structures 2B is less than that between any two adjacent ones of the strip-shaped sections $2x$ of the first resilient structures 2A.

However, the present disclosure is not limited to the examples provided herein. In another embodiment, each of the resilient structures 2 (including the first resilient structures 2A and the second resilient structures 2B) can extend between two sides of the two adjacent ones of the main sensor structures 1.

Furthermore, as shown in FIG. 1, each of the resilient structures 2 includes a connecting portion and a connecting wire. Specifically, each of the first resilient structures 2A includes a first connecting portion 20A and a first connecting wire 21A, and the first connecting wire 21A is disposed on the first connecting portion 20A. Specifically, the first connecting wire 21A of each of the first resilient structures 2A is connected between two of the first electrodes 111, which are respectively disposed on two adjacent ones of the arrangement portions 10 in the same row. That is to say, any two adjacent ones of the first electrodes 111 can be electrically connected by one of the first connecting wires 21A.

Similarly, each of the second resilient structures 2B includes a second connecting portion 20B and a second connecting wire 21B, and the second connecting wire 21B is disposed on the second connecting portion 20B. The second connecting wire 21B of each of the second resilient structures 2B is connected between two of the second electrodes 112 respectively disposed on two adjacent ones of the arrangement portions 10 in the same column. Furthermore, any two adjacent ones of the second electrodes 112 can be electrically connected by one of the second connecting wires 21B.

It should be noted that the arrangement portions 10, the first connecting portions 20A, and the second connecting portions 20B jointly form a base layer. Moreover, the sensor electrode pairs 11, the first connecting wires 21A, and the second connecting wires 21B jointly form a sensor layer. In the instant embodiment, the sensor layer is located at one side of the base layer and has a shape substantially the same as that of the base layer from the top view. However, the present disclosure is not limited to the aforementioned example.

As shown in FIG. 2, the touch sensor T1 further includes a protective layer 3 covering all of the main sensor structures 1 and the resilient structures 2. The protective layer 3 also has a plurality of hollow regions or opening patterns. In one embodiment, the protective layer 3 has substantially the same shape as the base layer from the top view.

Specifically, as shown in FIG. 1 and FIG. 2, the protective layer 3 includes a plurality of first portions 30 and a plurality of second portions 31. The first portions 30 are respectively disposed on the main sensor structures 1. Each of the first portions 30 has substantially the same shape as the arrangement portion 10 from the top view and covers the sensor electrode pair 11 of the corresponding one of the main sensor structures 1 so as to protect the sensor electrode pair 11 from being damaged.

Similarly, the second portions 31 are respectively disposed on the resilient structures 2. Each of the second portions 31 has substantially the same shape as the corresponding one of the resilient structures 2 that includes the first resilient structures 2A and the second resilient structures 2B. Since the resilient structures 2 would be elongated, downwardly tilted, or slightly twisted due to a pressing force applied to the touch sensor T1, it is necessary for the connecting wires to be protected from being easily damaged. Accordingly, the second portions 31 respectively cover the connecting wires (including the first and second connecting wires 21A, 21B) so as to protect the connecting wires.

Figure 4:
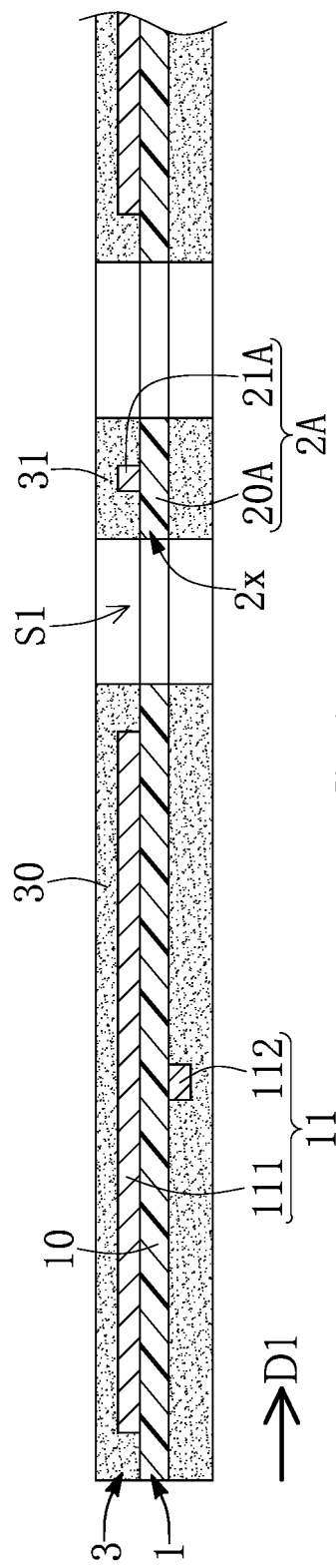
FIG. 4 is a cross-sectional schematic view of the touch sensor along a first direction according to one embodiment of the present disclosure.
Figure 5:
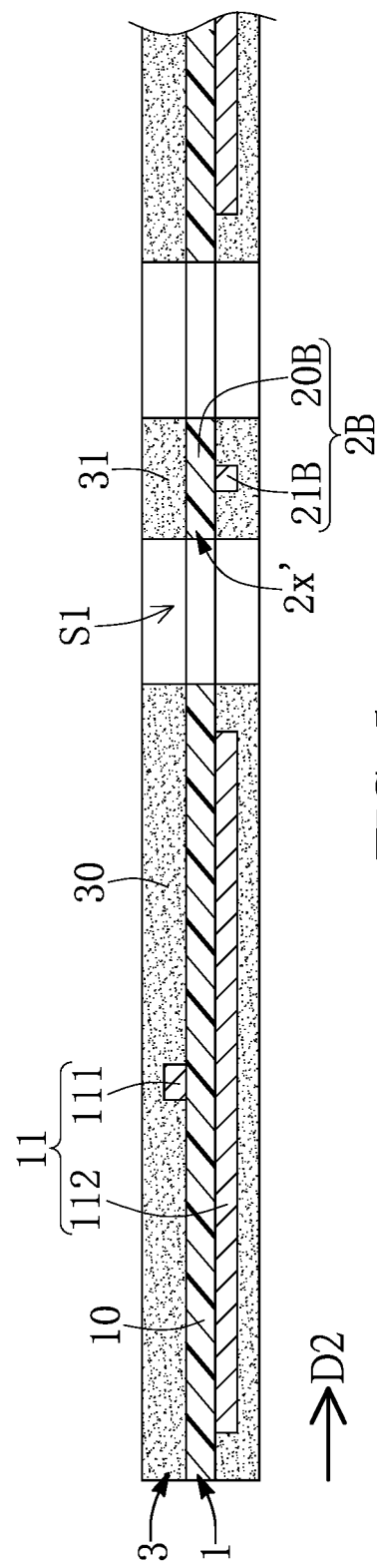
FIG. 5 is a cross-sectional schematic view of the touch sensor along a second direction according to one embodiment of the present disclosure.

Reference is made to FIG. 4 and FIG. 5, which are cross-sectional schematic views of the touch sensor respectively along the first and second directions according to another embodiment of the present disclosure. The elements which are similar to or the same as those shown in FIG. 2 and FIG. 3 are denoted by similar or the same reference numerals.

In the instant embodiment, the first and second electrodes 111, 112 of each of the sensor electrode pairs 11 are respectively located at two opposite sides of the arrangement portion 10 (or the base layer).

Specifically, as shown in FIG. 5, the first electrodes 111 of the sensor electrode pairs 11 and the first connecting wires 21A jointly form a first sensor layer. As shown in FIG. 4, the second connecting wires 21B and the second electrodes 112 of the sensor electrode pairs 11 jointly form a second sensor layer. The first sensor layer and the second sensor layer are respectively located at two opposite sides of the base layer.

Figure 6:
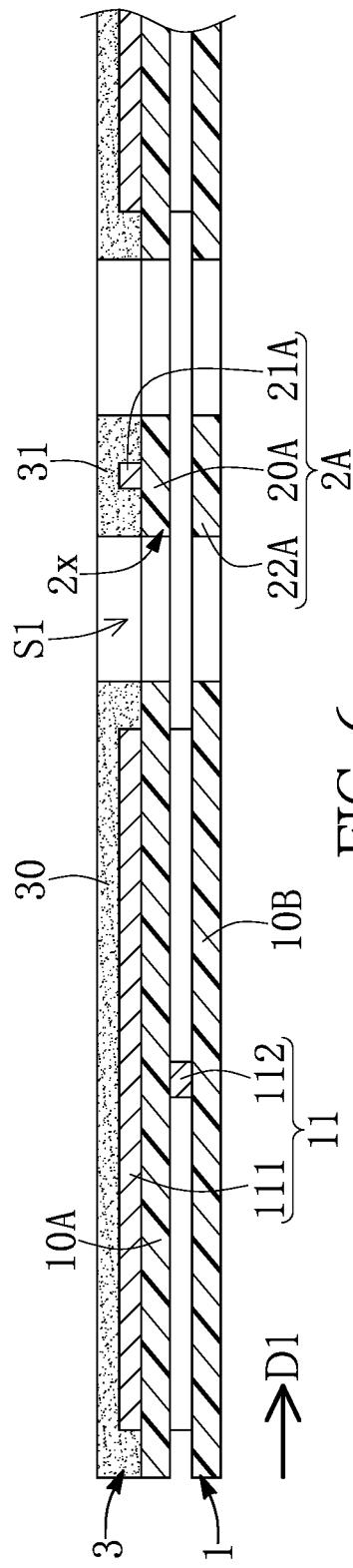
FIG. 6 is a cross-sectional schematic view of the touch sensor along the first direction according to another embodiment of the present disclosure.
Figure 7:
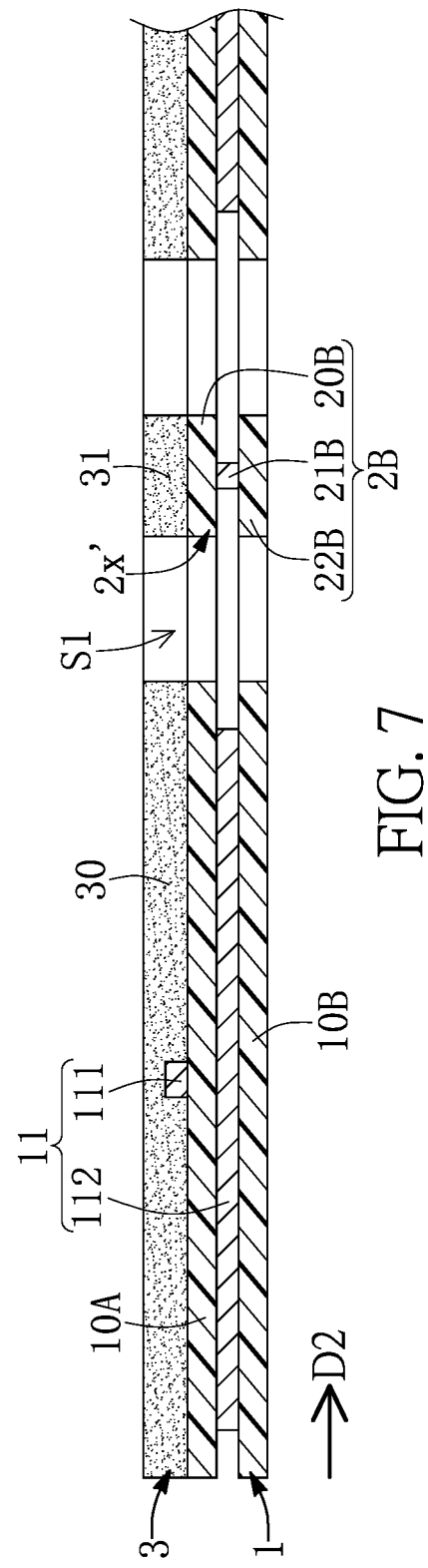
FIG. 7 is a cross-sectional schematic view of the touch sensor along the second direction according to one embodiment of the present disclosure.

Reference is made to FIG. 6 and FIG. 7, which are cross-sectional schematic views of a touch sensor respectively along the first and second directions according to another embodiment of the present disclosure. The elements which are similar to or the same as those shown in FIG. 2 and FIG. 3 are denoted by similar or the same reference numerals.

As shown in FIG. 6, in the instant embodiment, each of the main sensor structures 1 includes the sensor electrode pair 11, a first arrangement portion 10A, and a second arrangement portion 10B that overlap with one another in a thickness direction of the main sensor structure 10. The first and second electrodes 111, 112 of each of the sensor electrode pairs 11 are respectively located at the first and second arrangement portions 10A, 10B and insulated from each other. One of the first and second electrodes 111, 112 is disposed between the first and second arrangement portions 10A, 10B. In the instant embodiment, the second electrode 112 is disposed between the first and second arrangement portions 10A, 10B, and the first electrode 111 and the second electrode 112 are respectively located at two opposite sides of the second arrangement portion 10B.

Furthermore, as shown in FIG. 6, each of the first resilient structures 2A is connected between two adjacent ones of the main sensor structures 1 that are arranged in the first direction D1, and each of the first resilient structures 2A includes a first connecting portion 20A, a first connecting wire 21A, and a first dummy portion 22A. The first connecting portion 20A is connected between two adjacent ones of the first arrangement portions 10A that are arranged in the first direction D1, and the first dummy portion 22A is connected between two adjacent ones of the second arrangement portions 10B that are arranged in the first direction D1. Accordingly, in the instant embodiment, the first dummy portion 22A is located below the first connecting portion 20A, and the first connecting wire 21A is disposed on the first connecting portion 20A. The first connecting portion 20A, the first connecting wire 21A and the first dummy portion 22A have substantially the same outline from the top view.

As shown in FIG. 7, each of the second resilient structures 2B is connected between two adjacent ones of the main sensor structures 1 that are arranged in the second direction D2, and each of the second resilient structures 2B includes a second connecting portion 20B, a second connecting wire 21B, and a second dummy portion 22B. The second connecting portion 20B is connected between two adjacent ones of the second arrangement portions 10B that are arranged in the second direction D2, and the second dummy portion 22B is connected between two adjacent ones of the first arrangement portions 10A that are arranged in the second direction D2. Accordingly, in the instant embodiment, the second connecting portion 20B is located below the second dummy portion 22B, and the second connecting wire 21B is disposed between the second connecting portion 20B and the second dummy portion 22B. The second connecting portion 20B, the second connecting wire 21B and the second dummy portion 22B have substantially the same outline from the top view.

Referring to FIG. 6, which is to be read in conjunction with FIG. 7, it should be noted that the first arrangement portions 10A of the main sensor structures 1, the first connecting portions 20A of the first resilient structures 2A, and the second dummy portions 22B of the second resilient structures 2B jointly form a first base layer. Furthermore, the second arrangement portions 10B of the main sensor structure 1, the second connecting portions 20B of the second resilient structures 2B, and the first dummy portions 22A of the first resilient structures 2A jointly form a second base layer. Similar to the embodiment shown in FIG. 1, the first and second base layers have substantially the same shape from the top view. That is to say, each of the first and second base layers has a plurality of opening patterns or hollow regions.

Furthermore, the first electrodes 11 and the first connecting wires 21A jointly form the first sensor layer. The second electrodes 112 and the second connecting wires 21B jointly form the second sensor layer. The first sensor layer and the second sensor layer are respectively formed on the first and second base layers.

However, the structure of the touch sensor T1 is not limited to the aforementioned examples. In another embodiment, the shapes of the first and second electrodes 111, 112 from the top view may be modified according to practical requirements.

Figure 8:
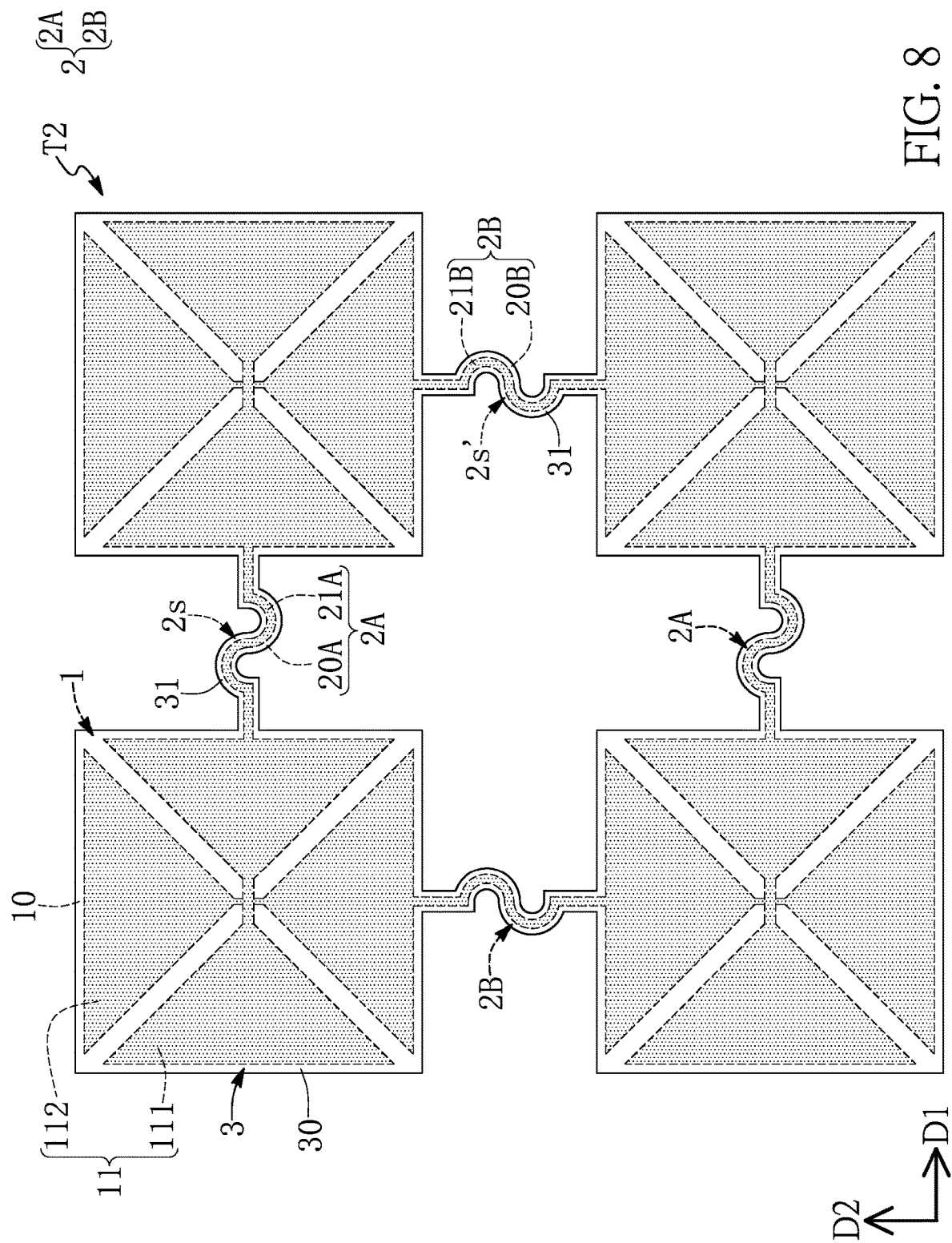
FIG. 8 is a partial top schematic view of a touch sensor according to a second embodiment of the present disclosure.

Reference is made to FIG. 8, which is a partial top schematic view of a touch sensor according to a second embodiment of the present disclosure. The elements which are similar to or the same as those shown in FIG. 1 are denoted by similar or the same reference numerals.

In a touch sensor T2 of the instant embodiment, each of the main sensor structures 1 has four sides, and the four sides are each connected to one of the resilient structures 2. To be more specific, each of the resilient structures 2 extends across the gap G1 between two adjacent ones of the main sensor structures 1 and is connected between two closer sides of the two adjacent ones of the main sensor structures 1.

Furthermore, each of the resilient structures 2 has a curved section 2s, 2s' from the top view. As shown in FIG. 8, the curved section 2s, 2s' is substantially in an "S" shape, but the present disclosure is not limited thereto. In another embodiment, the curved shape 2s may be in a "V" shape, "U" shape, or "C" shape.

That is to say, as long as the main sensor structures 1 and the resilient structures 2 jointly form a mesh-like or net-like structure so that the stretchability of the touch sensor T1 is improved, and the sensor electrode pairs 11 can be electrically connected to one another, the top-view shape of each of the resilient structures 2 is not limited to the examples provided herein.

The touch sensor T1 (T2) of the present disclosure can be implemented in an electronic product, such as a keyboard, a mouse, or a watch, so as to not only detect touch events and touched positions, but also provide a tactile sensation to a user.

Figure 9:
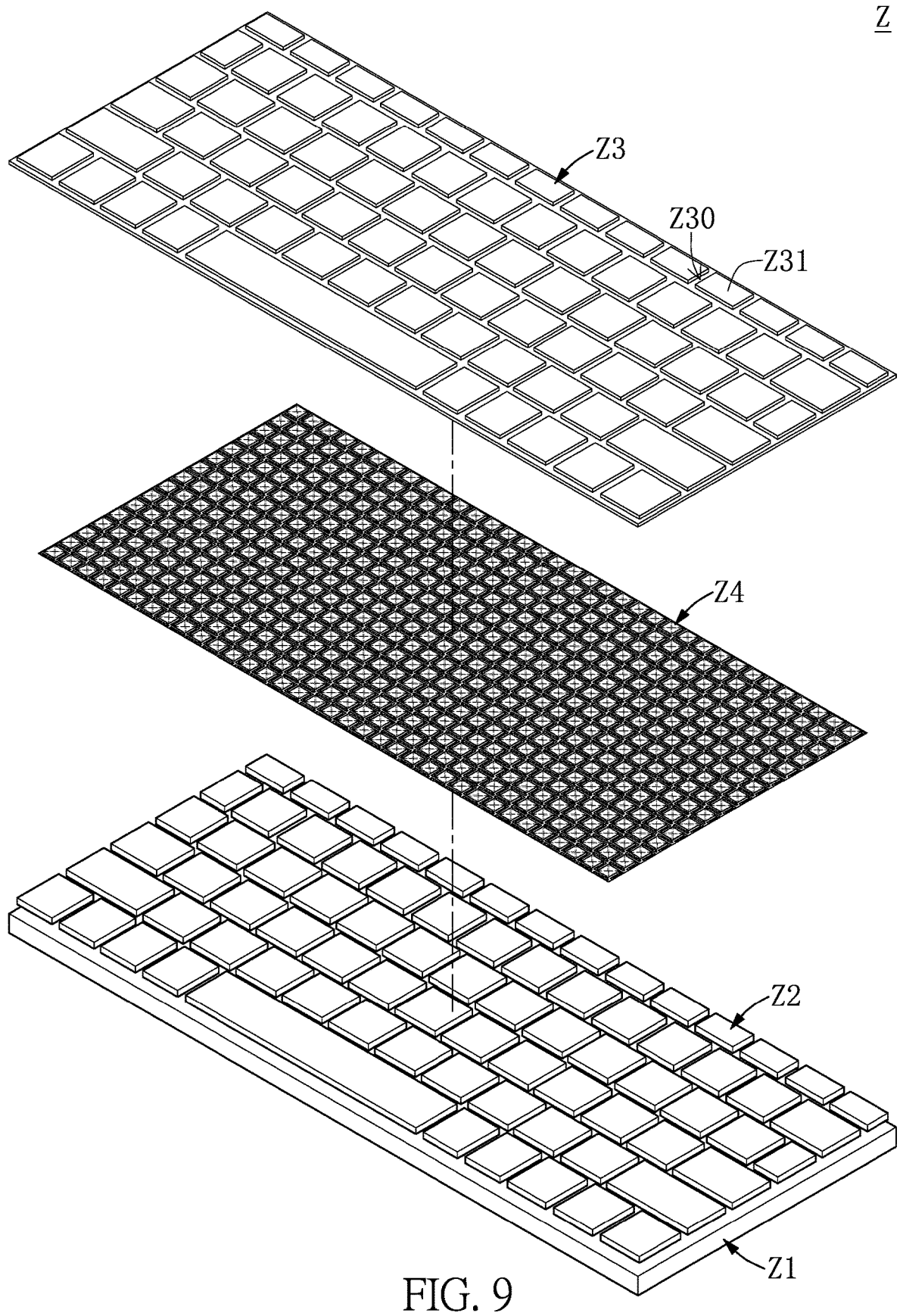
FIG. 9 is an exploded view of a keyboard according to one embodiment of the present disclosure.
Figure 10:
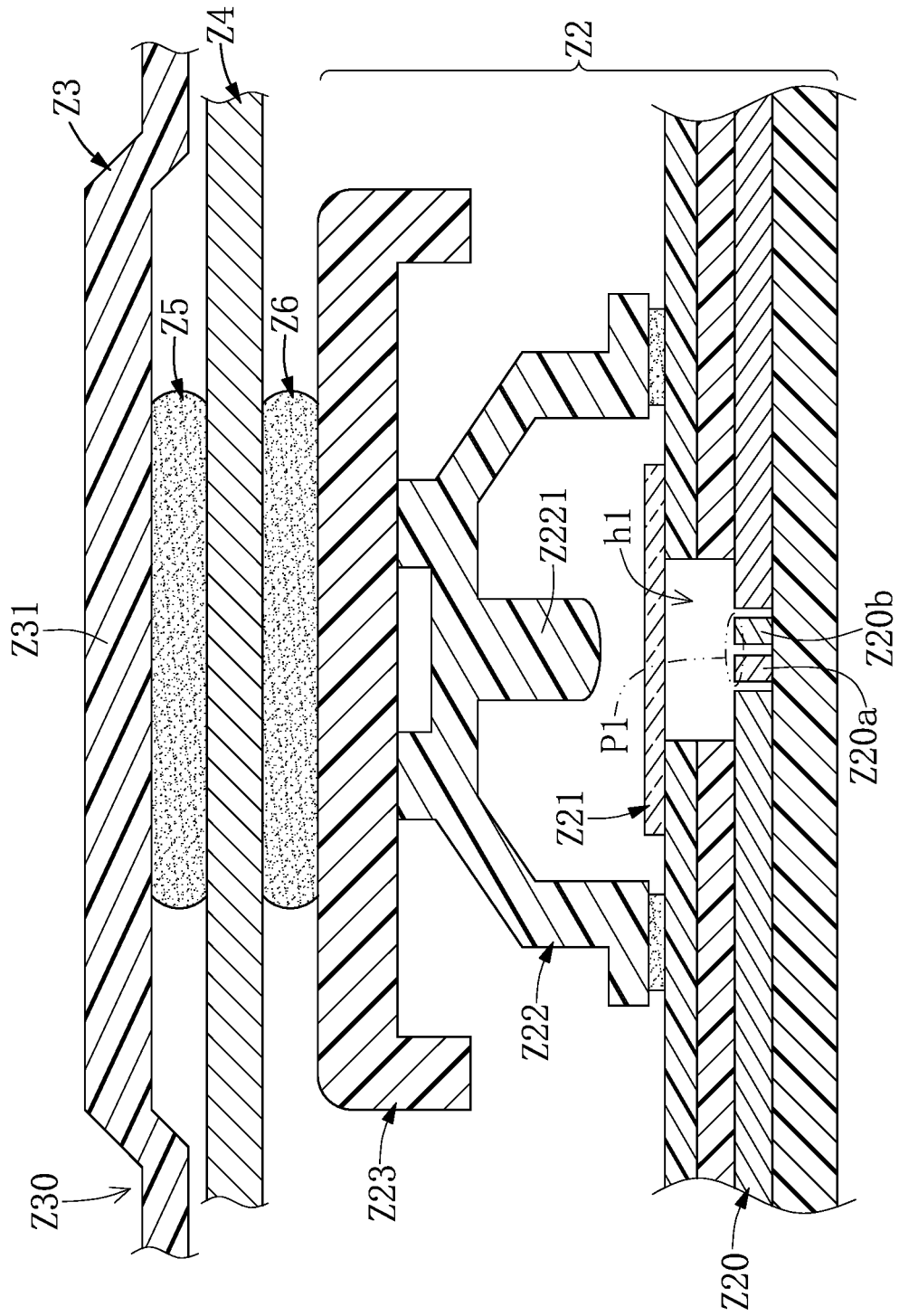
FIG. 10 is a side schematic view of one of a plurality of key units according to one embodiment of the present disclosure.
Figure 11:
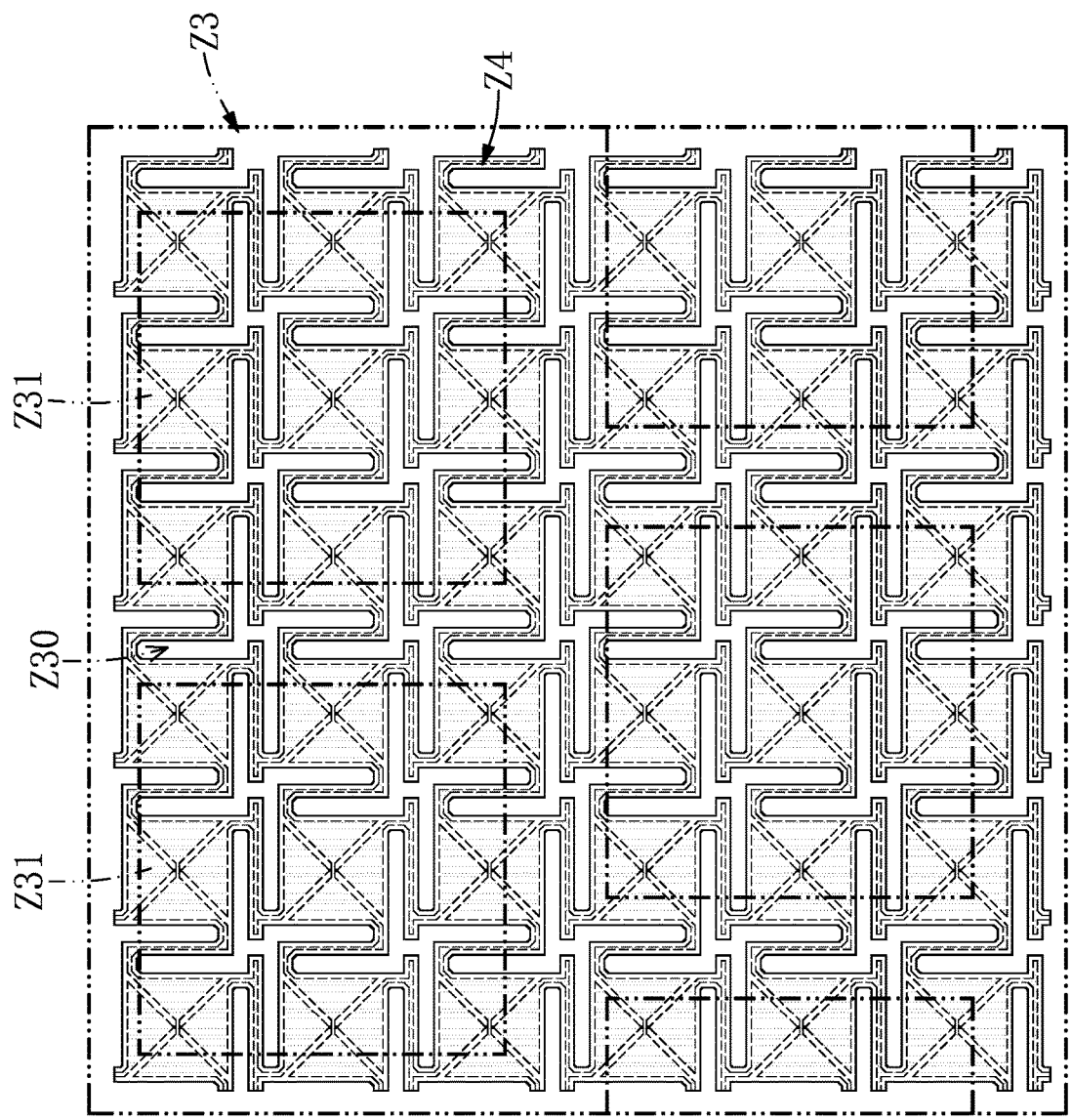
FIG. 11 is an enlarged top schematic view of the keyboard according to the embodiment of the present disclosure.

Reference is made to FIG. 9 to FIG. 11. FIG. 9 is an exploded view of a keyboard according to an embodiment of the present disclosure. FIG. 10 is a side schematic view of one of the key units according to an embodiment of the present disclosure. FIG. 11 is an enlarged top view of the keyboard according to the embodiment of the present disclosure The keyboard Z is shown as a stand-alone keyboard rather than one integrated with a computer. However, in another embodiment, the keyboard Z can be integrated within the housing or chassis of the computer or other components of other devices, such as a mobile phone, an electronic book, computer, a laptop, a tablet computer, a stand-alone keyboard, an input device, an accessory (such a tablet case with a build-in keyboard), a monitor, an electronic kiosk, a gaming device, an automated teller machine (ATM), a vehicle dashboard, a control panel, a medical workstation, and an industrial workstation.

The keyboard Z can be electrically coupled to or integrated in a computer system to serve as a user interface so that a user can input a command. Moreover, the keyboard Z can also include a touchpad and other input mechanisms, which are not shown in FIG. 9, but the present disclosure is not limited to the example provided herein.

It should be noted that in one embodiment of the present disclosure, the keyboard Z is a mechanical keyboard capable of detecting coupling capacitance signals. In one embodiment, the keyboard Z can be a touch sensitive mechanical keyboard for detecting both touching and pressing events.

As shown in FIG. 9, the keyboard Z includes a housing Z1, a plurality of key units Z2, a covering layer Z3, and a touch sensor Z4.

The housing Z1 may include a bottom board and a top plate to define an accommodating space. The plurality of key units Z2 are housed in the housing Z1 and arranged in an array. Specifically, the key units Z2 can be accommodated in the accommodating space of the housing Z1. However, a portion of each of the key units Z2 is exposed from the housing Z1 for convenience in operation.

Each of the key units Z2 includes a switch sensing circuit Z20, a flexible conductive film Z21, an elastic element Z22, and a keycap Z23.

The switch sensing circuit Z20 is embedded in a circuit board for detecting pressing events. The switch sensing circuit Z20 includes a first detecting layer Z20a and a second detecting layer Z20b which are insulated from each other and alternately arranged at the same insulating layer. As shown in FIG. 10, a portion of the first detecting layer Z20a and a portion of the second detecting layer Z20b are spaced apart from each other so as to define a contact point P1 therebetween.

It should be noted that the circuit board has an opening hl corresponding to the contact point P1. The flexible conductive film Z21 is disposed above the switch sensing circuit Z20 and covers the opening hl. The flexible conductive film Z21 can be made of a conductive and resilient material, such as a carbon film.

The elastic element Z22 is disposed above the flexible conductive film Z21. The keycap Z23 is movably disposed above and spaced apart from the circuit board by the elastic element Z22. That is to say, the elastic element Z22 is made of a compressible and resilient material and is disposed between the keycap Z23 and the switch sensing circuit Z20, so that the keycap Z23 moves between an unpressed position and a pressed position with respect to the circuit board. The elastic element Z22 can be a rubber dome or a metallic dome. Furthermore, the elastic element Z22 includes a protrusion portion Z221, and the elastic element Z22 is disposed on the circuit board with the protrusion portion Z221 being in alignment with the opening hl and the contact point P1 in a thickness direction of the circuit board.

When the key unit Z2 is in an unpressed state (i.e., the keycap Z23 is located at the unpressed position), the protrusion portion Z221 can be disposed above and spaced apart from the flexible conductive film Z22. When the key unit Z2 is pressed by a user with an object F, such as a finger, and held in a pressed state (i.e., the keycap Z23 is located at the pressed position), the elastic element Z22 is deformed due to the applied pressure, and the protrusion portion Z221 moves downwardly and forces the flexible conductive film Z21 to extend into the opening hl and be in contact with the contact point P1 below. As such, the switch sensing circuit Z20 is closed and then transmits a pressing signal.

Accordingly, the keyboard Z may further include a processing circuit (not shown in FIG. 10) that is electrically connected to the switch sensing circuit Z20 of each of the key units Z2. The processing circuit receives the pressing signal transmitted from the switching sensing circuit Z20, and determines that the keycap Z23 corresponding to the switching sensing circuit Z20 is pressed. In one embodiment, the processing circuit may be integrated into the circuit board.

As shown in FIG. 9, the covering layer Z3 covers the housing Z1 and the key units Z2. The covering layer Z3 may be made of a material having a tactile quality, such as leather. The covering layer Z3 includes a plurality of protrusion regions Z31 that define a plurality of recess regions Z30. Specifically, the covering layer Z3 is disposed on the housing Z1 and covers all of the key units Z2 with the protrusion regions Z31 being respectively in alignment with the key units Z2. As shown in FIG. 9 and FIG. 10, it should be noted that each of the protrusion portions Z31 represents a corresponding character or command. Furthermore, an outer surface of the covering layer Z3 can serve as a touch sensitive surface.

The touch sensor Z4 is disposed between the key units Z2 and the covering layer Z3. The touch sensor Z4 can be any one of the touch sensors T1, T2, the details of which have been described in the aforementioned descriptions. In the instant embodiment shown in FIG. 10 and FIG. 11, the touch sensor T1 shown in FIG. 1 is exemplified for description, but the present disclosure is not limited thereto.

As shown in FIG. 11, each of the protrusion regions Z31 corresponds to a number of the main sensor structures 1 of the touch sensor Z4. Specifically, when the user touches one of the protrusion regions Z31 with an object F, such as a finger or a conductive object, and does not press the protrusion regions Z31 (or the keycaps Z23), the electric fields of the sensor electrode pairs 11 under the touched protrusion region Z31 are altered, thus changing the coupling capacitances. Furthermore, each of the sensor electrode pairs 11 can be electrically connected to the processing circuit, such that the processing circuit can detect a variation of the coupling capacitance between each of the sensor electrode pairs 11, thereby determining which one or more of the protrusion portions Z31 are touched.

Compared to the conventional keyboard, in which the touch sensitive circuit is embedded in the circuit board and located under the keycap, the sensitivity of the touch sensor Z4 of the present disclosure is higher since the touch sensor Z4 is disposed between the covering layer Z3 and the key units Z2.

The keyboard Z further includes a plurality of upper adhesive layers Z5 (only one upper adhesive layer is exemplarily illustrated FIG. 10) and a plurality of lower adhesive layers Z6 (only one lower adhesive layer is exemplarily illustrated in FIG. 10). The covering layer Z3 is fixed on the touch sensor Z4 by the upper adhesive layers Z5, and the touch sensor Z4 is fixed on the key units Z2 by the lower adhesive layers Z6.

Specifically, a part of the plurality of main sensor structures 1 is connected between the corresponding one of the protrusion region Z31 and the corresponding one of the keycaps Z23 respectively by the upper and lower adhesive layers Z5, Z6. However, a remaining part of the plurality of main sensor structures 1 is neither connected to the upper adhesive layers Z5 nor the lower adhesive layers Z6.

As such, as one of the protrusion regions Z31 is pressed, a number of the main sensor structures 1 connected to the pressed protrusion region Z31 are pressed downwardly relative to another number of the main sensor structures 1 connected to another protrusion region Z31 that is unpressed. Each of the resilient structures 2 that is connected between one of the pressed main sensor structures 1 and one of the unpressed main sensor structures 1 may be elongated, downwardly tilted, or slightly twisted, so that the number of the main sensor structures 1 force the keycap Z23 below to move downwardly.

That is to say, the touch sensor Z4 including the resilient structures 2 can be partially deformed as one of the protrusion regions Z31 is pressed. Specifically, as one of the protrusion regions Z31 is pressed, the resilient structures 2 can prevent the touch sensor Z4 from interfering with a downward motion of the keycap Z23.

In conclusion, one of the advantages of the present disclosure is that in the touch sensor T1, T2 and the keyboard Z using the same provided herein, by virtue of "any two adjacent ones of the main sensor structures 1 having a gap G1 therebetween" and "each of the resilient structures 2 being connected between two adjacent ones of the main sensor structures 1, and each of the resilient structures 2 having a cross-sectional width less than a width of the gap G1," the touch sensor T1, T2 can be partially deformed. When the touch sensor T1, T2 is implemented in the keyboard Z, the resilient structures 2 allows the number of the main sensor structures 1 under the pressed protrusion regions Z31 of the covering layer Z3 to be individually deformed and can prevent the touch sensor T1, T2 from interfering with the downward motion of the keycap Z23. Furthermore, the keyboard Z including the touch sensor T1, T2 of the present disclosure can provide a better tactile sensation to the user.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A touch sensor comprising:
 a base layer including a plurality of arrangement portions and a plurality of connecting portions, wherein a gap is formed between any two adjacent ones of the arrangement portions, which allows one of the connecting portions to be connected therebetween;
 a plurality of sensor electrode pairs respectively disposed on the arrangement portions to form a plurality of main sensor structures; and
 a plurality of connecting wires respectively disposed on the connecting portions to form a plurality of resilient structures, wherein each of the resilient structures has a cross-sectional width that is less than a width of the gap;
 wherein each of the resilient structures has a strip-shaped section located in the gap and two bending sections, and the two bending sections are respectively connected to two opposite ends of the strip-shaped section and respectively extend toward two adjacent ones of the arrangement portions;
 wherein the resilient structures include:
 a plurality of first resilient structures, wherein each of the first resilient structures is connected between two adjacent ones of the main sensor structures that are arranged in a first direction, and the strip-shaped section of each of the first resilient structures extends along a second direction and has a first length; and
 a plurality of second resilient structures, wherein each of the second resilient structures is connected between two adjacent ones of the main sensor structures that are arranged in the second direction, the strip-shaped section of each of the second resilient structures extends along the first direction and has a second length, and the second length is greater than the first length.

2. The touch sensor according to claim 1, wherein a shortest distance between any two adjacent ones of the strip-shaped sections of the second resilient structures is less than that between any two adjacent ones of the strip-shaped sections of the first resilient structures.

3. A touch sensor comprising:
a base layer including a plurality of arrangement portions and a plurality of connecting portions, wherein a gap is formed between any two adjacent ones of the arrangement portions, which allows one of the connecting portions to be connected therebetween;
a plurality of sensor electrode pairs respectively disposed on the arrangement portions to form a plurality of main sensor structures; and
a plurality of connecting wires respectively disposed on the connecting portions to form a plurality of resilient structures, wherein each of the resilient structures has a cross-sectional width that is less than a width of the gap;
wherein each of the sensor electrode pairs includes a first electrode and a second electrode that are insulated from each other, and the first electrode and the second electrode partially overlap with each other in a thickness direction of the base layer;
wherein the connecting wires include a plurality of first connecting wires and a plurality of second connecting wires, each of the first connecting wires is connected between two of the first electrodes that are respectively disposed on two adjacent ones of the arrangement portions, and each of the second connecting wires is connected between two of the second electrodes that are respectively disposed on two adjacent ones of the arrangement portions.

4. The touch sensor according to claim 3, wherein the first electrode and the second electrode of each of the sensor electrode pairs are respectively located at two opposite sides of the base layer.

5. A keyboard comprising:
a plurality of key units, wherein each of the key units includes a keycap;
a covering layer disposed on the key units, wherein the covering layer includes a plurality of protrusion regions in alignment with the keycaps of the key units, respectively; and
a touch sensor disposed between the key units and the covering layer;
wherein the touch sensor includes:
a base layer including a plurality of arrangement portions and a plurality of connecting portions, wherein a gap is formed between any two adjacent ones of the arrangement portions, which allows one of the connecting portions to be connected therebetween;
a plurality of sensor electrode pairs respectively disposed on the arrangement portions to form a plurality of main sensor structures; and
a plurality of connecting wires respectively disposed on the connecting portions to form a plurality of resilient structures, wherein each of the resilient structures has a cross-sectional width that is less than a width of the gap.

6. The keyboard according to claim 5, further comprising a plurality of upper adhesive layers and a plurality of lower adhesive layers, wherein a part of the plurality of main sensor structures is connected to the corresponding protrusion regions by the upper adhesive layers and connected to the corresponding keycaps by the lower adhesive layers, and a remaining part of the plurality of main sensor structures is not connected to the upper adhesive layers and the lower adhesive layers.

7. The keyboard according to claim 6, wherein the touch sensor further includes a protective layer, and each of the sensor electrode pairs is disposed between the base layer and the protective layer.

* * * * *